(12) United States Patent
Im

(10) Patent No.: US 6,675,329 B1
(45) Date of Patent: Jan. 6, 2004

(54) INTERNAL MEMORY IN APPLICATION SPECIFIC INTEGRATED CIRCUIT DEVICE AND METHOD FOR TESTING INTERNAL MEMORY

(75) Inventor: Jin Seok Im, Seoul (KR)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 09/541,698

(22) Filed: Apr. 3, 2000

(30) Foreign Application Priority Data

Apr. 3, 1999 (KR) .......................................... 1999/11750

(51) Int. Cl.[7] ........................... G11C 29/00; G11C 7/00; G11R 31/28
(52) U.S. Cl. ........................ 714/718; 714/738; 365/201
(58) Field of Search ................................ 714/719, 726, 714/733, 735, 736, 738, 718, 734, 242, 743, 744; 365/189.01, 189.04, 189.05, 189.08, 190, 191, 194, 200, 201, 105, 230.01, 230.08, 236, 239; 326/93, 38; 711/104

(56) References Cited

U.S. PATENT DOCUMENTS

| | | | | |
|---|---|---|---|---|
| 4,996,691 A | * | 2/1991 | Wilcox et al. | 714/820 |
| 5,276,837 A | * | 1/1994 | Sakaue | 365/230.05 |
| 5,546,569 A | * | 8/1996 | Proebsting et al. | 713/600 |
| 5,555,524 A | * | 9/1996 | Castellano | 365/221 |
| 5,661,692 A | * | 8/1997 | Pinkham et al. | 365/230.05 |
| 5,675,545 A | * | 10/1997 | Madhavan et al. | 365/201 |
| 5,764,967 A | * | 6/1998 | Knaack | 713/500 |
| 6,011,748 A | * | 1/2000 | Lepejian et al. | 365/233 |
| 6,067,262 A | * | 5/2000 | Irrinki et al. | 365/201 |
| 6,085,346 A | * | 7/2000 | Lepejian et al. | 714/733 |
| 6,108,802 A | * | 8/2000 | Kim et al. | 714/718 |
| 6,226,766 B1 | * | 5/2001 | Harward | 714/719 |
| 6,338,154 B2 | * | 1/2002 | Kim | 714/743 |
| 6,367,042 B1 | * | 4/2002 | Phan et al. | 714/733 |

* cited by examiner

Primary Examiner—Stephen M. Baker
Assistant Examiner—Matthew C. Dooley
(74) Attorney, Agent, or Firm—Birch, Stewart, Kolasch & Birch, LLP

(57) ABSTRACT

An internal memory in an ASIC device which is capable of allowing timing constraints to control signals in an asynchronous two-port RAM is disclosed. The present internal memory includes delays which synchronizes the timing of the read and write signals. Also, a method for easily and accurately testing a two-port RAM is disclosed, allowing a stable implementation of an internal memory in an ASIC device.

9 Claims, 4 Drawing Sheets

INTERNAL MEMORY IN APPLICATION SPECIFIC INTEGRATED CIRCUIT DEVICE AND METHOD FOR TESTING INTERNAL MEMORY

BACKGROUND OF THE INVENTION

1. Field of the Invention

The present invention relates to an internal memory and more particularly, to an internal memory of an application specific integrated circuit (ASIC) device.

2. Discussion of Related Art

As the application fields and designs for ASIC devices continue to increase, the ASIC chip becomes more complicated. Accordingly, the amount of memory required to support the variety of functions also increases significantly. Compared to the access time of a high-speed ASIC chip, an external memory such as a dynamic random access memory (DRAM) or a static random access memory (SRAM) has a considerably slow access time. Thus, depending upon the size and speed of the chip, there is a strong need for an internal memory.

When an internal memory is utilized in the chip, several conditions should be taken into consideration. First, the control signals in the internal memory should be designed and implemented to build a layout which meets the timing constraints such that the memory and chip can operate in a stable manner. Second, upon completing the fabrication of the ASIC chip, the chip should be tested to determine whether the memory operates in a normal manner. Generally, a core memory provided by a vendor is utilized as an internal memory and such memory is typically an asynchronous core memory in a high-speed ASIC.

For example, FIG. 1 shows a block diagram of an asynchronous two-port random access memory (TPRAM) in the related art, while FIG. 2 is a timing diagram which illustrates a read cycle of the two-port RAM in FIG. 1 and FIG. 3 is a timing diagram which illustrates a write cycle of the two-port RAM in FIG. 1. The conventional two-port RAM, as shown in FIG. 1, has a structure of an asynchronous two-port RAM, which is used as an internal memory. Referring to FIGS. 2 and 3, when a read enable signal REB and a write enable signal WEB are in an active state, a read address RA and a write address WA should not have a transition.

To satisfy the timing constraint, careful attention must be given to the place and route (P&R). In other words, when the chip is being operated by a high-speed clock, the timing margin for the control signals of the memory cannot be satisfied due to wire delay caused by the P&R. As a result, a set-up or hold violation occurs. Therefore, an effort of a back-end designer to change the floor-plan of the memory cell and to set an optimal routing is required. However, when the arrangement and layout of the chip is changed due to a change in the design and/or an addition of a new module, the arrangement and routing of core memory must be set again. Thus, one of the problems which arise is a difficulty in designing and re-using the memory core.

Also, a typical testing method used after the production of an internal memory is a Built in Self Test (BIST). The BIST requires a pseudo random pattern generator (PRPG) to generate a test pattern and access addresses, and a multiple input shift register (MISR) to compare the test results. To reduce the overhead in the flip-flop of the MISR and PRPG, a built-in logic block observe (BILBO) method which uses the flip-flops existing in the design may be employed. In the BILBO method, gates such as a few flip-flops and exclusive OR circuits for testing are added.

Furthermore, a fixed test pattern and an address incrementor are used as a comparable test method of the random test pattern. If the flip-flop existing in the design is used along with the address incrementor for the purpose of comparing the test results, the number of additional gates is similar to the number of gates used in the test using the BILBO. This method using the fixed test pattern can access all memory addresses but increases an error masking probability which is caused due to the fixed pattern.

Therefore, in the conventional asynchronous two-port RAM used as an internal memory in the ASIC, the timing margin for the control signals of the memory may not be satisfied when the chip is operated by a high-speed clock, resulting in a set-up or hold violation. Also, if the cell design is altered, there is a difficulty in re-using the memory. Finally, by using the random test pattern and a random address generator, there may be address areas where the test is not carried out, thereby increasing the error masking probability.

SUMMARY OF THE INVENTION

Accordingly, an object of the present invention is to solve at least the problems and disadvantages of the related art.

An object of the invention is to provide an internal memory in an ASIC device which is capable of allowing timing constraint to control signals in an asynchronous two-port RAM such that the ASIC device is stabilized.

Another object of the invention is to provide an internal memory in an ASIC device which easily allows re-use and re-design of the memory.

A further object of the invention is to provide a method for easily and accurately testing an internal memory in an ASIC device.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve the objects and in accordance with the purposes of the invention, as embodied and broadly described herein, an internal memory in an ASIC device, includes a two-port RAM in which read/write signals are processed by a single clock; first and second delays for delaying a write clock and a read clock to satisfy the timings of a write enable signal and a read enable signal of the two-port RAM; a first logic for inputting a synchronous write enable signal, a synchronous write address signal and a synchronous data in signal as a first input, and the write clock as a second input, said first logic inputting an output state based upon the input value to the two-port RAM; a second logic for logically ORing the synchronous write enable signal value input from the first logic and the output value from the first delay to output the OR-ed result to the write enable in the two-port RAM; a third logic for inputting a synchronous read enable signal, a synchronous read address signal and a synchronous data out signal as a first input, and the read clock as a second input, said third logic inputting an output state based upon the input value to the two-port RAM; and a fourth logic for logically ORing the synchronous read enable signal value input from the third logic and the output value from the second delay to output the OR-ed result to the read enable in the two-port RAM.

According to a second embodiment of the present invention, a method for testing an internal memory in an ASIC device, includes generating an address incrementor start signal in a state machine to an address incrementor, generating a test data select signal to an input pattern generator, and generating a compare enable signal to a test result comparator; sending a test address signal in the address incrementor inputting the address incrementor start signal to a memory tester and sending a test write data signal in the input pattern generator to the memory tester; inputting test read data in the memory tester in accordance with the test address signal in the address incrementor and the test write data in the input pattern generator, to the test result comparator; inputting and comparing the test result data of the memory tester and a shift in signal inputted from an arbitrary synchronous two-port RAM in the test result comparator; and shift-outputting the test result based upon the compared result.

BRIEF DESCRIPTION OF THE ATTACHED DRAWINGS

The invention will be described in detail with reference to the following drawings in which like reference numerals refer to like elements wherein.

DETAILED DESCRIPTION OF PREFERRED EMBODIMENT

Reference will now be made in detail to the preferred embodiments of the present invention, examples of which are illustrated in the accompanying drawings.

Figure 1:
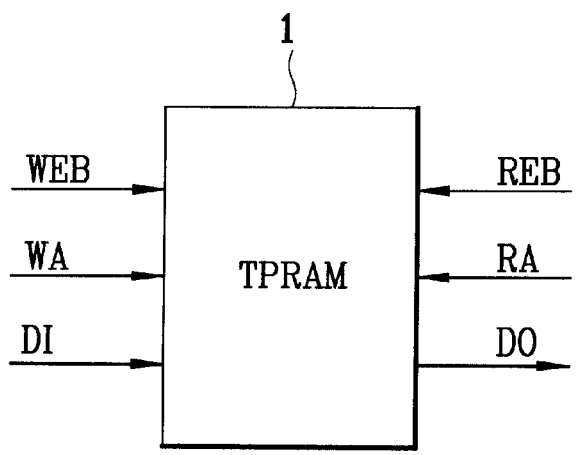
FIG. 1 is a block diagram of an asynchronous two-port RAM in the related art.
Figure 2:
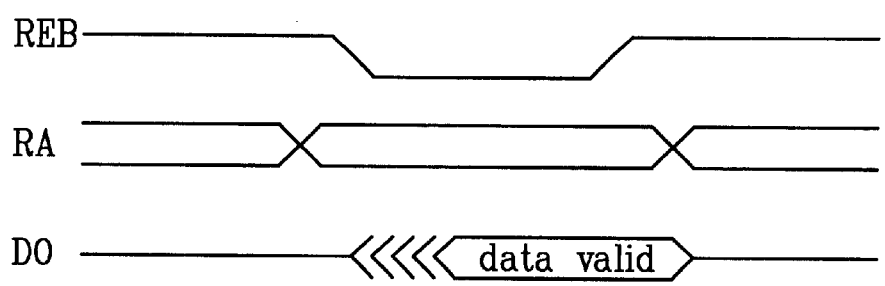
FIG. 2 is a timing diagram illustrating a read cycle of the two-port RAM in FIG. 1.
Figure 3:
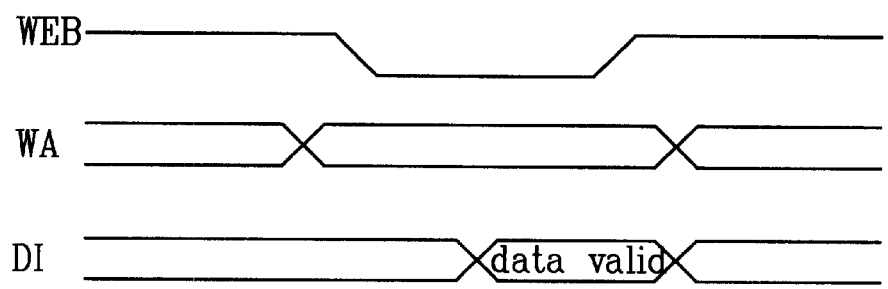
FIG. 3 is a timing diagram illustrating a write cycle of the two-port RAM in FIG. 1.
Figure 4:
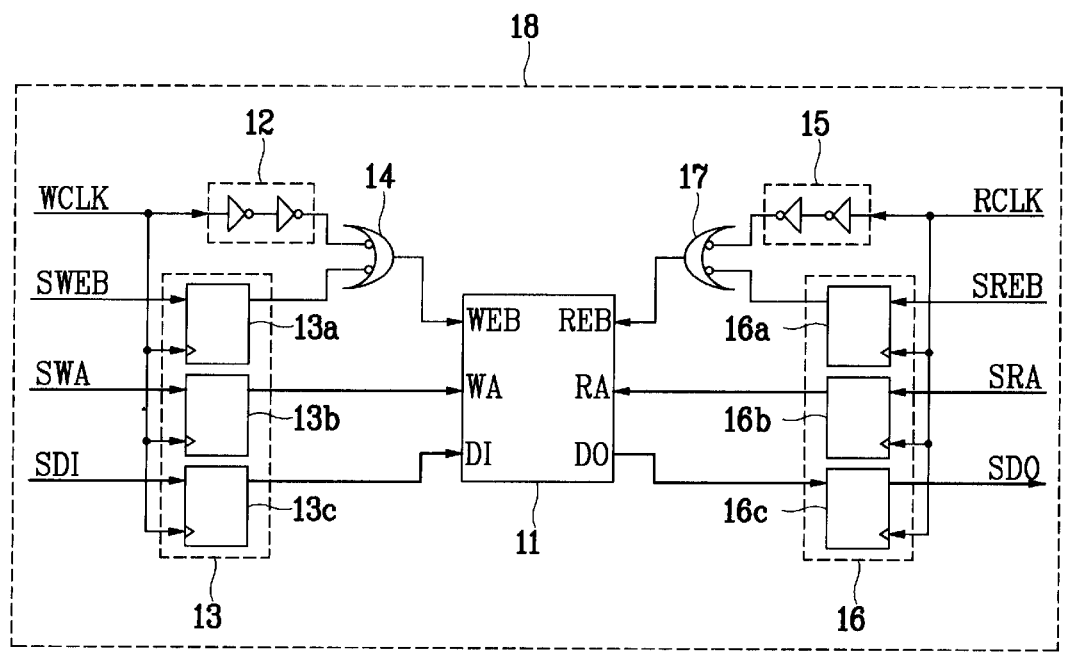
FIG. 4 is a block diagram of a synchronous two-port RAM according to the present invention.
Figure 5:
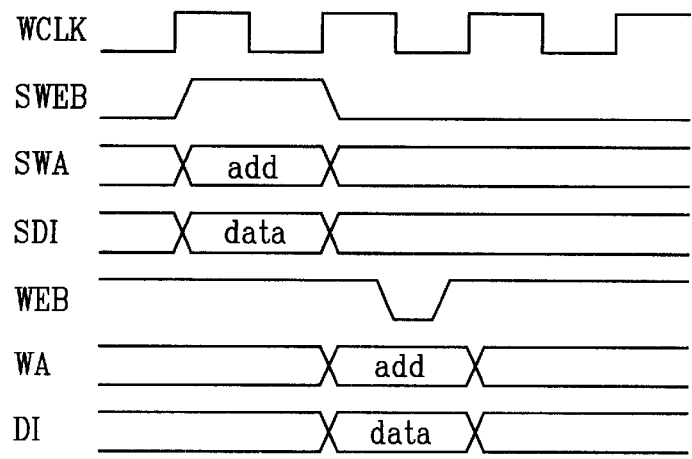
FIG. 5 is a timing diagram illustrating a write cycle of the synchronous two-port RAM in FIG. 4.
Figure 6:
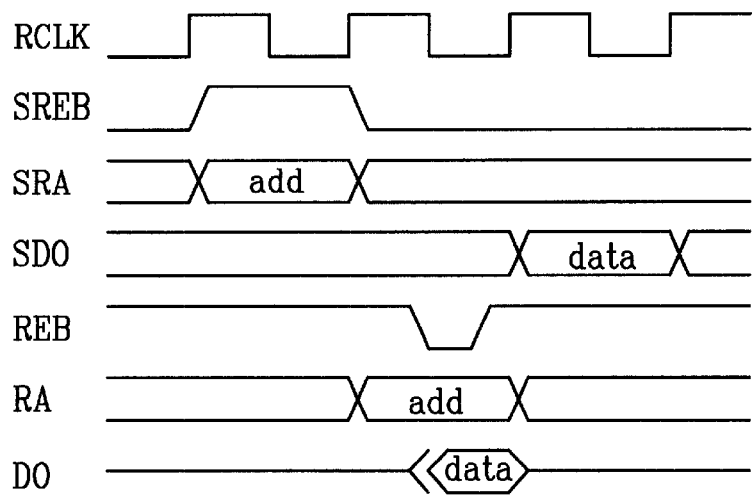
FIG. 6 is a timing diagram illustrating a read cycle of the synchronous two-port RAM in FIG. 4.

Referring to the drawings, FIG. 4 is a block diagram of a synchronous two-port RAM (STRAM) according to the present invention. FIG. 5 is a timing diagram illustrating a write cycle of the STRAM in FIG. 4 and FIG. 6 is a timing diagram illustrating a read cycle of the STRAM in FIG. 4.

As shown in FIG. 4, a STRAM 18 according to the present invention includes a conventional two-port RAM 11 in which read/write are executed by a single clock; first and second delays 12 and 15 which respectively delays a write clock WCLK and a read clock RCLK to satisfy the timings of a write enable signal WEB and a read enable signal REB of the two-port RAM 11; a first logic 13 which inputs signals to maintain an output state based upon the input values; a second logic 14 which executes an OR logic operation on a signal value output from a first logic 13 and the output value from the first delay 12 to output an OR-ed result to the write enable signal WEB in the two-port RAM 11; a third logic 16 which inputs signals to maintain an output state based upon the input values; and a fourth logic 17 which executes an OR operation on a signal value output from the third logic 16 and the output value from the second delay 15 to output the OR-ed result to the read enable REB in the two-port RAM 11.

Here, the first logic 13 is implemented by flip-flops 13a~13c. Also, the first logic 13 receives a synchronous write enable signal SWEB, a synchronous write address signal SWA, and a synchronous data of signal SDI, each as first inputs and receives the write clock WCLK as a second input. The second logic 14 logically ORs the signal value output from the flip-flop 13a, i.e. the SWEB signal, and the output value from the first delay 12, i.e. the delayed WCLk signal, such that the two-port RAM can synchronously process all signals.

Similarly, the third logic 16 is implemented by flip-flops 16a to 16c. The third logic 16 receives a synchronous read enable signal SREB, a synchronous read address signal SRA, and a synchronous data out signal SDO, each as first inputs and receives the read clock RCLK as a second signal. Accordingly, the fourth logic 17 logically ORs the signal value output from the flip-flop 16a, i.e. the SREB signal, and the output value from the second delay 15, i.e. the delayed RCLK, such that the two-port RAM can synchronously process all signals.

At this time, the write clock WCLK and the read clock RCLK have the different timing periods. The synchronous write enable signal SWEB, the synchronous write address SWA and the synchronous data of signal SDI are synchronous to the write clock WCLK. On the other hand, the synchronous read enable signal SREB, the synchronous read address SRA and the synchronous data of signal SDO are synchronous to the read clock RCLK.

As a result, the STRAM 18 according to the present invention synchronously processes the signals necessary for the access of the memory, i.e. the two-port RAM 11 of FIG. 4. The module using the two-port RAM 11 synchronizes the read and write addresses RA and WA, the read and write enable signals REB and WEB, and the data to the read and write clocks RWCK and WCLK.

Particularly, the first and second delays 12 and 15 delay the write clock WCLK and the read clock RCLK to satisfy the timings of the write enable signal WEB and the read enable signal REB of the two-port RAM 11. The delayed signals are used to ensure a stabilized timing with respect to both the synchronous write enable signal SWEB and the synchronous read enable signal SREB.

FIGS. 5 and 6 show the write and read timings of the STRAM. Namely, the two-port RAM 11 adjusts the amount of delay to satisfy the P&R, such that the read enable signal REB and the write enable signal WEB are active (ACTIVE LOW) within a stable portion of the address and data. Therefore, malfunctions which occurs while accessing the two-port RAM may be prevented. In other words, the STRAM as described above satisfies the timing constraint by using a synchronous shell. Thus, even if the position of the internal memory in the ASIC chip is changed, the memory access operates in a stable manner irrespective of cell delay and wire delay.

Figure 7:
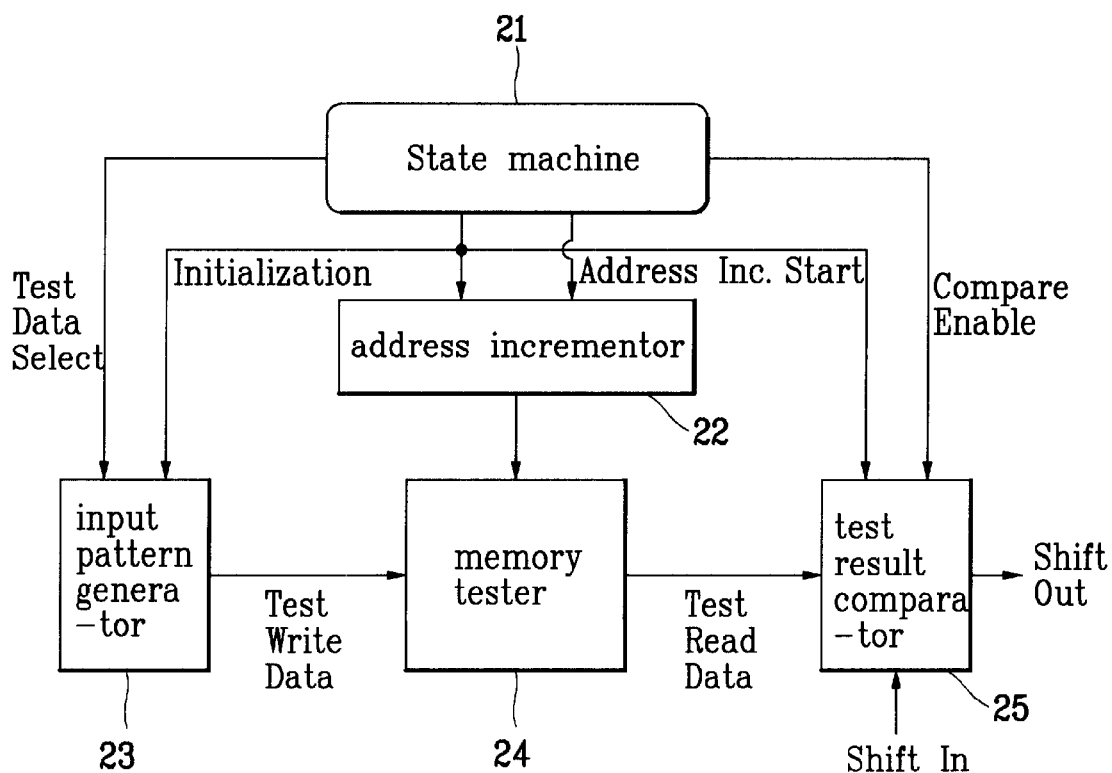
FIG. 7 is a block diagram illustrating the operation construction of a state machine in a test mode for testing the synchronous two-port RAM of the present invention.

FIG. 7 is a block diagram illustrating the operation of a state machine in a test mode for testing the STRAM of the present invention.

Referring to FIG. 7, a BIST state machine 21 issues instructions such as Test Start, Test Data Select, Result Compare Enable, and Shift Out valid for the purposes of testing each memory in a memory tester 24. The BIST state machine 21 sends an Address Incrementor Start signal to an address incrementor 22, the Test Data Select signal to an input pattern generator 23, and a Compare Enable signal to a test result comparator 25. The BIST state machine 21 also sends an Initialization signal to the input pattern generator 23, the address incrementor 22, and the test result comparator 25. Thereafter, the address incrementor 22 sends a Test Address signal to the memory tester 24 and the input pattern generator 23 sends a Test Write Data to the memory tester 24.

Depending upon the Test Address Signal and the Test Write Data received, the memory tester 24 generates and inputs a Test Read Data signal to the test result comparator 25. The test result comparator 25 receives the Test Read signal and compares the Test Read signal with Shift In signals to generate a shift out value as the test result.

Generally, to implement the testing of the STRAMS, the ASIC chip would have a pin for inputting a $mbist_{13}$ enable signal to initiate the test mode. Upon input of a $mbist_{13}$ enable signal, the BIST state machine 21 issues instructions such as Test Start, Test Data Select, Result Compare Enable, and Shift Out valid. Accordingly, the chip would also have a pin through which the Last Shift Out is output as a $mbist_{13}$ out signal and a pin through which the Shift Out Valid is output as a $mbist_{13}$ $out_{13}$ valid signal. Through the $mbist_{13}$ out signal and the $mbist_{13}$ $out_{13}$ valid signal, a determination can be made whether the STRAMs are operating in a normal manner.

The states of the BIST state machine 21 is shown in Table 1 below.

TABLE 1

| bist_mode[2:0] | Operation |
| --- | --- |
| 000 | Normal Operation |
| 001 | Test Initialization |
| 010 | Test Idle |
| 001 | Test Shift Out Valid |
| 100 | Test Run: Test Data - type 00 |
| 101 | Test Run: Test Data - type 01 |
| 110 | Test Run: Test Data - type 10 |
| 111 | Test Run: Test Data - type 11 |

Each of the two-port RAM enters a testing operation in the $bist_{13}$ mode[2:0] and serves as a shift register during the Test Shift Out Valid Mode ('001') to serially output the test result of each memory in the test chain. Also, during the test mode of the internal memory, the flip-flops in the STRAM are utilized as the address incrementor, the test data select register, and the control signal register.

Because there are internal memories of different depth and width on each module of the ASIC chip, the BIST state machine 21 controls the test mode ('100,' '101,' '110,' '111,') externally from the internal memory. At this time, the test data has four test data patterns, namely '0000 0000,' '0101 0101,' '1010 1010,' and '1111 1111.' Depending upon the $bist_{13}$ mode[2:0] of the BIST state machine 21, the type of test data is selected.

The BIST state machine 21 maintains the test run mode for a period of the number of STRAMS times the size of the STRAM having the maximum depth. Also, each STRAM operates the address incrementor, which generates the test data corresponding to the width from the address value of '0' to the last address, thereby writing the test data generated on the addresses of the two-port RAM. After writing the test data, the data is read from the two-port RAM and is compared with the write data to determine whether the read data is the same as the write data. If all data of the test addresses are normally written and read, the Shift Out signal is set to a value of '1'.

Figure 8:
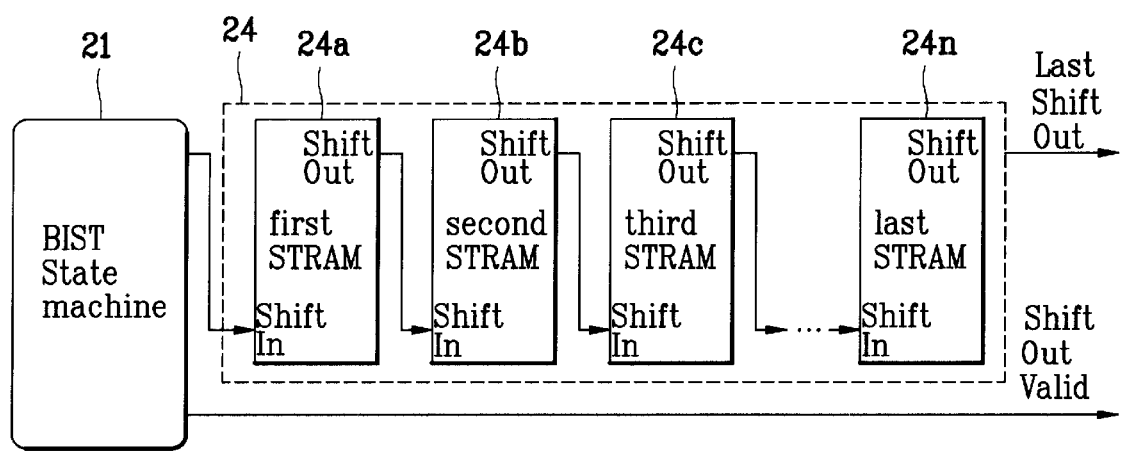
FIG. 8 is a block diagram illustrating a test chain of the synchronous two-port RAM of the present invention.
Figure 9:
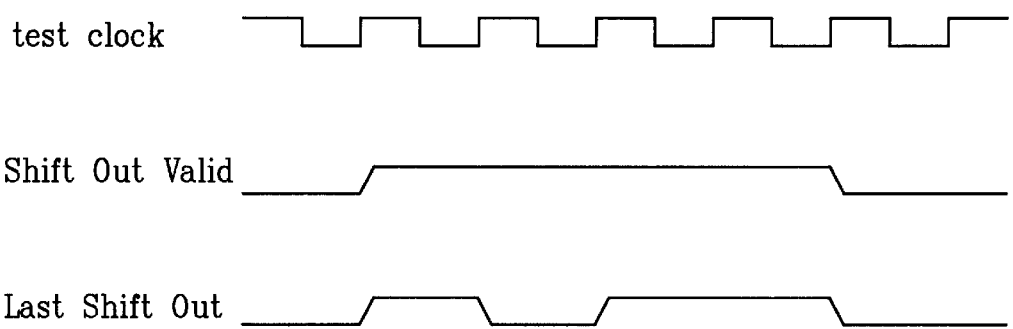
FIG. 9 is a timing diagram illustrating shift out in the test chain of the synchronous two-port RAM of FIG. 8.

FIG. 8 shows a STRAMS of the present invention in a test chain and FIG. 9 shows a timing diagram illustrating Shift Out in the test chain of FIG. 8.

The test chain, as illustrated in FIG. 8, includes the BIST state machine 21 which generates a test signal including a test clock for testing the two-port RAM and which generates the Shift Output signals. The test chain also includes a plurality of STRAMs 24a~24n, each receiving the test clock of the BIST state machine 21 to execute the test and outputting the test signal to the adjacent STRAM. Particularly, each STRAM 24a~24n has a shift in at which the test signal is input and a shift out at which the test result is output.

The first STRAM 24a receives the test signal of the BIST state machine 21 at the shift in and outputs the test signal through the shift out to the shift in of the second STRAM 24b. Similarly, the third STRAM 24c receives the test signal from the second STRAM 24b and outputs the test signal to the next STRAM. The process continues until the last STRAM 24n receives the test signal through the shift in and outputs the test signal through the shift out.

For example, assuming that there are four STRAMs in the test chain and if the test clock is generated periodically, as shown in FIG. 9, the Shift Out value generated from the BIST state machine 21 would produce a Last Shift Out during an active state of four clocks. The Last Shift Out signal is output from the last STRAM 24n and is the timing diagram indicating a third synchronization. As shown in FIG. 9, the Shift Out Valid produced a Last Shift Out during three clocks rather than four. Accordingly, based on the position at which the Last Shift Out has not been produced, a determination that the third STRAM is not operating in a normal manner can be made.

Therefore, the internal memory in an ASIC device and method for testing the internal memory according to the present invention have the following advantages. First, since the design of the synchronous two-port RAM allows a rapid memory access required for a high-speed ASIC while satisfying the timing constraint, a stable internal memory can be realized and re-used regardless of the addition of a design module and variation of the P&R. Also, it is easy to find a defect contained in the internal memory, while minimizing the overhead of the flip-flop and the gate count.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. An internal memory in an application specific integrated circuit device comprising:
   a two-port RAM in which read/write are executed by a single clock;
   a first delay which delays a write clock to satisfy the timing of a write enable signal of the two-port RAM and outputs a delayed write clock;
   a second delay which delays a read clock to satisfy the timing of a read enable signal of the two-port RAM and outputs a delayed read clock;

a first logic which receives the write enable signal, a write address signal, and input data as a first input, and the write clock as a second input, said first logic outputting state based signals based upon the first and second inputs to the two-port RAM; and a second logic which receives the read enable signal, a read address signal, and output data as a third input, and the read clock as a fourth input, said second logic outputting state based signals based upon the third and fourth inputs to the two-port RAM.

2. An internal memory of claim 1, wherein the first logic comprises a third logic which executes an OR operation on the write enable signal value and the delayed write clock, and outputs the first OR-ed result to a write enable in the two-port RAM; and wherein the second logic comprises a fourth logic which executes an OR operation on the read enable signal value and the delayed read clock, and outputs the second OR-ed result to a read enable in the two-port RAM.

3. An internal memory of claim 1, wherein the first logic comprises:

a first flip-lop receiving the write enable signal as the first signal and the write clock as the second signal;

a second flip-flop receiving the write address signal as the first signal and the write clock as the second signal;

a third flip-flop receiving the input data as the first signal and the write clock as the second signal; and wherein the second logic comprises:

a fourth flip-flop receiving the read enable signal as the third signal and the read clock as the fourth signal;

a fifth flip-flop receiving the read address signal as the third signal and the read clock as the fourth signal;

a sixth flip-flop receiving the output data as the third signal and the read clock as the second signal.

4. An internal memory of claim 1, wherein the write enable signal, the write address signal and the input data are synchronous to the write clock, and the read enable signal, the read address signal and the output data are synchronous to the read clock.

5. An internal memory of claim 4, wherein the write enable signal, the write address signal and the input data are synchronously processed by the two-port RAM based upon the delayed write clock, and the read enable signal, the read address signal and the output data are synchronously processed by the two-port RAM based upon the delayed read clock.

6. A method for testing an internal memory or claim 1 comprising:

(a) generating in a state machine an address incrementor start signal, a test data select signal, and a compare enable signal;

(b) sending the address incrementor start signal to an address incrementor, sending the test data select signal to an input pattern generator, and sending the compare enable signal to a test result comparator;

(c) sending a test address signal from the address incrementor to a memory tester and sending a test write data signal from the input pattern generator to the memory tester;

(d) generating a test read data depending upon the test address signal and the test write data signal, and comparing the test read data to a test signal to shift-output a test result based upon the compared result.

7. A method of claim 6, wherein (d) comprises:

maintaining a test run mode by a BIST state machine for a period equivalent to the number of internal memories in a test chain times the size of an internal memory having the largest depth;

operating the address incrementor by each internal memory in the test chain to generate test read data corresponding to the width of each internal memory, and writing the test read data in each corresponding internal memory;

reading and comparing the test read data from each internal memory to a corresponding write data and determining whether the internal memory is functioning in a normal manner.

8. A method of claim 7, wherein each of the internal memory has a shift in through which a test signal is input and a shift out through which a test result is output.

9. A method of claim 8, wherein a first internal memory receives a test signal from the BIST state machine at a corresponding shift in and outputs the test signal through a corresponding shift out to a second internal memory;

the second internal memory receives the test signal through a corresponding shift in and outputs the test signal through a corresponding shift out to a next internal memory if the second internal memory is not the last internal memory in the test chain; and otherwise each of the remaining internal memories receiving the test signal through a corresponding shift in and outputting the test signal through a corresponding shift out.

* * * * *